United States Patent [19]

Yoshikawa et al.

[11] Patent Number: 4,577,320
[45] Date of Patent: Mar. 18, 1986

[54] LIGHT POWER CONTROLLING APPARATUS

[75] Inventors: Shoji Yoshikawa; Masaharu Sakamoto, both of Tokyo, Japan

[73] Assignee: Olympus Optical Co., Ltd., Tokyo, Japan

[21] Appl. No.: 575,042

[22] Filed: Jan. 30, 1984

[30] Foreign Application Priority Data

Feb. 10, 1983 [JP] Japan .................................. 58-21311

[51] Int. Cl.[4] .............................................. H01S 3/13
[52] U.S. Cl. .......................................... 372/29; 372/38
[58] Field of Search ............................ 372/26, 29, 38; 250/305; 332/2.51

[56] References Cited

U.S. PATENT DOCUMENTS

| | | | |
|---|---|---|---|
| 3,898,583 | 8/1975 | Shuey | 372/26 |
| 4,292,606 | 9/1981 | Trimmel | 372/38 |
| 4,450,564 | 5/1984 | Meuleman et al. | 372/26 |
| 4,516,242 | 5/1985 | Yokota | 372/26 |

FOREIGN PATENT DOCUMENTS

| | | | |
|---|---|---|---|
| 0147984 | 12/1976 | Japan . | |
| 0140886 | 11/1979 | Japan | 372/29 |

OTHER PUBLICATIONS

Chen, "Simultaneous Feedback Control of Bias and Modulation Currents for Injection Lasers", *Electronics Letters*, Jan. 3, 1980, vol. 16, No. 1.

*Primary Examiner*—James W. Davie
*Attorney, Agent, or Firm*—Frishauf, Holtz, Goodman & Woodward

[57] ABSTRACT

A light power controlling apparatus contains a semiconductor laser and a photosensor for receiving part of light emitted from the semiconductor laser to produce a corresponding electrical signal. The semiconductor laser is connected to first and second current circuits. The first current circuit averages a voltage signal based on the electrical signal of the photosensor by a first low-pass filter, thereby to have a detected voltage. The detected voltage is compared with a desired voltage by an error amplifier. The error amplifier produces a signal representing a difference between the detected voltage and the desired voltage. The difference signal is integrated by an integrator. According to the integrated signal, the first current circuit supplies a forward current to the semiconductor laser. The second current circuit is set at a peak power value in a modulating mode according to a voltage signal of a peak power setting member. The second current circuit supplies to the semiconductor laser a forward current according to a modulating signal, with superposing on the forward current of the first current circuit. The modulating signal is averaged by a second low pass filter. A voltage representing the product of the averaged value and the peak power value is added to the desired value. The sum voltage is then supplied to the error amplifier where it is compared with the detected voltage.

8 Claims, 4 Drawing Figures

FIG. 2
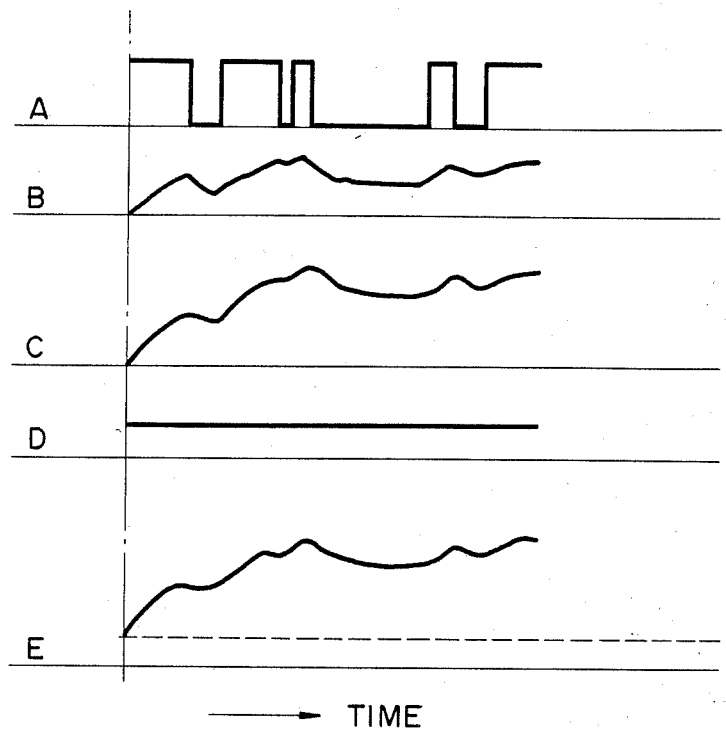
FIG. 3
FIG. 4
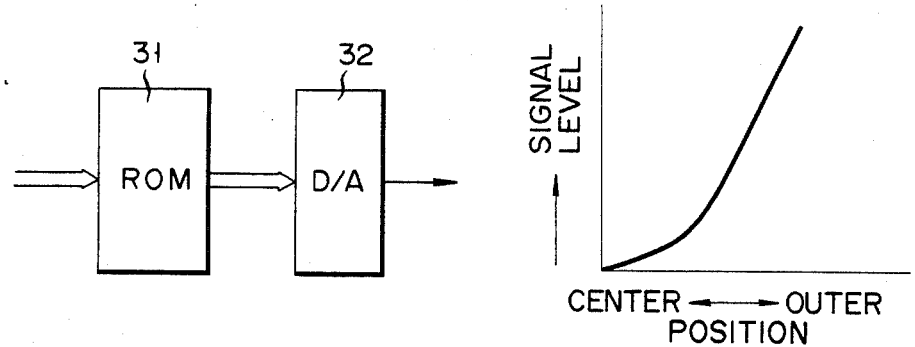

LIGHT POWER CONTROLLING APPARATUS

BACKGROUND OF THE INVENTION

The present invention relates to a light power controlling apparatus for automatically controlling light power generated by a semiconductor light emitter, e.g. a semiconductor laser. The output characteristics of a semiconductor light emitter such as a semiconductor laser describes that a forward current more than a threshold voltage is required for the light emission of the semiconductor light emitter. The threshold value is a function of temperature, and increases with temperature rise. To keep the light power at a fixed value, it is necessary to regulate the forward current fed to the semiconductor light emitter. For this regulation, the light power controlling apparatus is used. In the conventional light power controlling apparatus, the semiconductor light emitter is connected through a switching circuit for modulation to a current regulator. A photosensor, receiving part of the light from the semiconductor light emitter, produces an electrical signal for transfer to a current-voltage converter, i.e. an I–V converter. The output voltage of the I–V converter, i.e. a detecting voltage, is compared, by an error amplifier, with a reference voltage representative of a desired value of the light power. The error amplifier produces an output signal representing a difference between the detected value and the desired value. The difference signal is integrated by an integrator. The integrated signal from the integrator is supplied, as a feedback control signal, to the current regulator. Upon receipt of this signal, the current regulator supplies forward current to the semiconductor light emitter. In this way, the output light power of the semiconductor light emitter is kept at a fixed value.

The above controlling apparatus operates so as to zero the difference between the average value of the light power and the desired value. No problem in particular arises when the semiconductor light emitter operates in a continuous light emission mode. The following problem, however, arises when the light output of the semiconductor light emitter is modulated. When the switching duty ratio of the switching circuit changes, the peak value of the modulated light also changes. For 40:10 of the duty ratio of the modulated waveform, an average value of the modulated light is approximate to its maximum value. For 10:40 of the duty ratio, the average value of the modulated light is much smaller than the average value in the case of the former duty ratio. This implies that the light power changes with the duty ratio.

For a high switching speed, the feedback system can not follow the high switching speed at the start and end of the operation. The result is a great fluctuation of the output power. This problem may be improved by increasing the response speed of the feedback system up to a value satisfactorily higher than the switching cycle. This measure still involves problems, however. A high frequency signal of several MHz of more is treated in the optical disk or the laser printer. Such device is inevitably accompanied by stray capacitance. Therefore, this necessitates some means to remove the stray capacitance, leading to restriction in variation of usable circuit components and high cost to manufacture.

SUMMARY OF THE INVENTION

Accordingly, an object of the present invention is to provide a light power controlling apparatus which operates stably against temperature change to produce a constant light power, has an invariable peak value of the modulated light against a great fluctuation of the duty ratio of the modulated signal waveform, and little power fluctuation at the start and end of modulation.

In the present invention, a semiconductor light emitter is driven by a forward current from a first current circuit, and emits light. Part of the light emitted is received by a photosensor and converted into a corresponding electric signal. The detected signal from the photosensor is compared with a desired value by an error amplifier. The error amplifier produces a signal of a difference between the detected signal and the desired value. The difference signal is integrated by an integrator and is fed as a feedback control signal to the first current circuit. This signal is integrated by an integrator and is fed back as a feedback control signal to the first current circuit. The first current circuit is connected in parallel with a first current circuit, via a modulating switching circuit. A peak power at the time of modulation is set in the second current circuit. The desired value is added to the product of a signal representing an averaged form factor of the modulating signal and the set value of the peak power. The first current circuit is controlled by the signal representing the added value, thereby to attain a stabilization of the light power.

BRIEF DESCRIPTION OF THE DRAWINGS

FIG. 2 is a set of waveforms of signals at key portions in the circuit of FIG. 1;

FIG. 3 illustrates in block form a beam position information circuit used in the present embodiment; and FIG. 4 is a graphical representation of a signal level representing beam position information stored in a ROM in the FIG. 3 circuit.

DETAILED DESCRIPTION OF THE PREFERRED EMBODIMENT

Figure 1:
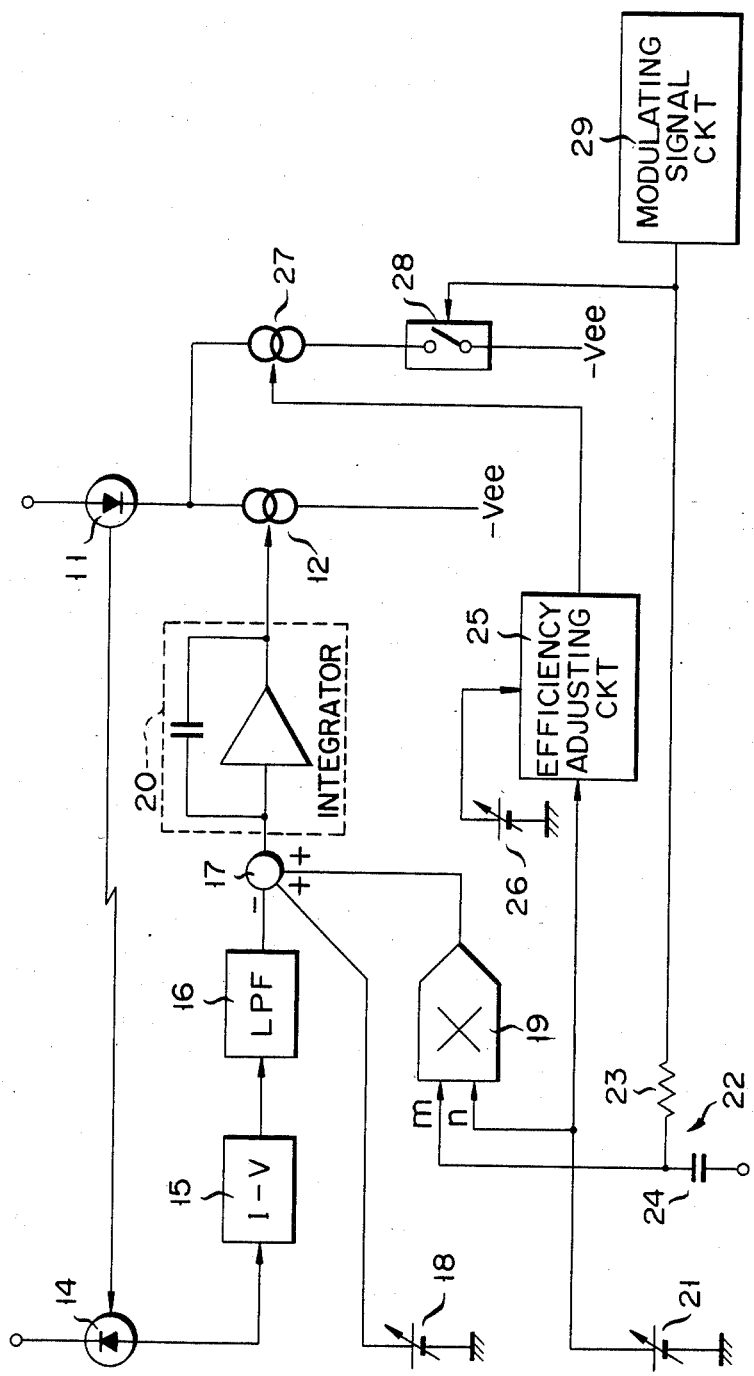
FIG. 1 illustrates in block and schematic form an embodiment of a light power controlling apparatus according to the present invention.

In FIG. 1, a semiconductor light emitter, e.g. a semiconductor laser 11, is connected through a second current regulator 27 to a power source Vee. A photosensor 14, receiving and converting part of light emitted from the semiconductor laser 11 into a corresponding electric signal, is connected to a current to a voltage converter 15. The output terminal of the I–V converter 15 is connected to an input terminal of a low-pass filter 16. The output terminal of the low-pass filter 16 is connected to an inverting terminal of an operational amplifier 17 as an error amplifier. One of noninverting terminals of the operational amplifier 17 is connected to a light power setting member 18 for setting a desired value of the light power when it is not modulated. The noninverting terminal is connected to an input terminal of an integrator 20. The output terminal of the integrator 20 is connected to a control terminal of the first current regulator 12. One of the input terminals of an analog multiplier 19 is connected to a peak power setting member 21 for setting a peak value of the light power when it is not modulated. The other input terminal is connected to a low-pass filter 22 including a resistor 23 and a capacitor 24. The peak power setting member 21 is connected to the input terminal of an efficiency adjusting circuit 25. A variable power source 26 is connected to the efficiency adjusting circuit 25. The output terminal of the efficiency adjusting circuit 25 is connected to the control terminal of a second current regulator 27. The efficiency adjusting circuit 25 is provided for adjusting a proportional relation between the output voltage of the peak power setting member 21 and the current value of the second current regualtor 27 so that the semiconductor laser 11 produces a light power corresponding to the output voltage of the peak power setting member 21. The second current regulator 27 is connected in parallel with the first current regulator 12 through a modulating circuit e.g. switching circuit 28. The modulating signal input terminal of the switching circuit 28 is connected to the output terminal of a modulating signal circuit 29. The output terminal of the modulating signal circuit 29 is connected to the low-pass filter 22.

The operation of the light power controlling apparatus thus arranged will separately be given in modulating and nonmodulating modes.

Non-Modulating Mode

To begin with, the power switch is turned on. The output voltage of the light power setting member 18 is supplied to the integrator 20 through the operational amplifier 17. The integrator 20 supplies a current control signal to the first current regulator 12. The first current regulator 12 responds to the output signal from the integrator 20 to supply the forward current to the semiconductor laser 11. When the forward current exceeds the threshold value, the semiconductor laser 11 begins to emit light. Part of the laser light from the semiconductor laser 11 is input to the photosensor 14. Then, the photosensor 14 produces photocurrent corresponding to the laser light power. The photocurrent is converted by the I-V converter 15 into a corresponding voltage. The output voltage of the I-V converter 15 is supplied to the low-pass filter 16 to be averaged. The output voltage of the low-pass filter 16 is supplied as a detected voltage to the error amplifier 17. The error amplifier 17 compares it with a reference voltage corresponding to a desired light power value. The error amplifier 17 produces a difference voltage corresponding to a difference between the detected signal and the reference signal. The difference voltage is integrated by the integrator 20. The integrator 20 feeds the integrated voltage representative of the difference voltage as the feedback control signal to the first current regulator 12. Then, the semiconductor laser 11 produces a light power dependent on the difference voltage. With increase of the light power of the semiconductor laser 11, the detected voltage input to the error amplifier 17 increase to reach the reference voltage from the power setting member 18. At this time, the output of the error amplifier 17 is zeroed. Under this condition, the output of the integrator 20 is balanced to regulate the output light power of the semiconductor laser 11 at the desired value.

When temperature change causes the light power of the semiconductor laser 11 to change, the detected voltage output from the low-pass filter 16 in turn changes according to a change amount of the light power. Then, the error amplifier 17 produces a difference signal dependent on the change amount. Upon receipt of this difference voltage, the integrator 20 applies to the first current regulator 12 a control signal to negate the change amount. The output light power of the semiconductor laser 11 is kept at a value corresponding to the set value in the light power setting member 18.

In the non-modulating mode, since no modulating signal is supplied to the switching circuit 28, the switching circuit 28 is in an OFF state. Under this condition, the second current regulator 27 stops its operation and therefore the semiconductor laser 11 operates from the first current regulator 12. Since one input m of the analog multiplier 19 is zero, the output of the analog multiplier 19, i.e. m×n, is also zero. Therefore, the output of the analog multiplier 19 does not influence the comparator any way.

Modulating Mode

When a modulating signal A shown in FIG. 2 is produced from the modulating signal circuit 29, the switching circuit 28 turns on and off according to the modulating signal. During the ON-period of the switching circuit 28, the second current regulator 27 feeds forward current to the semiconductor laser 11. As a result, the semiconductor laser 11 is supplied with the sum of the currents from the first current regulator 12 and the second current regulator 27. When the switching circuit 28 is turned on and off according to the modulating signal, the laser power of the semiconductor laser 11 is modulated while being increased. The modulated laser light is converted by the photosensor 14 into a photocurrent, and the photocurrent is supplied through the I-V converter 15 to the low-pass filter 16. In the low-pass filter 16, a form factor of the output voltage of the I-V converter 15 is averaged by the low-pass filter 16. Accordingly, the low-pass filter 16 produces a signal E which is the product of a signal C, as the product of the voltage corresponding to an average value of the form factor of the modulating signal and the output voltage of the peak power setting member 21, and the output voltage D of the light power setting member 18. The voltage signal E of the low-pass filter 16 is supplied to the error amplifier 17. At this time, the error amplifier 17 is also supplied with the output voltage D of the light power setting member 18 and the output voltage C of the analog multiplier 19. The analog multiplier 19 is supplied with the output voltage n of the peak power setting member 21 and the voltage m as the form factor of the modulating signal after it is averaged by the low-pass filter 22. Accordingly, the analog multiplier 19 produces the signal C which is the product of the signals m and n, i.e. M×n. Therefore, the low-pass filter 16 produces the voltage signal as expressed by (C+D)−E. This signal (C+D)−E stabilizes a fluctuation in the system. Thus, the total system is stable against disturbances such as temperature change, form factor change of the modulating signal, change of the peak power setting value, etc.

$(C+D)-E=O$ fails to hold unless the light power increasing with the current value controlled by the second current regulator 27 is coincident with the peak power setting value. It is for this reason that the efficiency adjusting circuit 25 is interposed between the peak power setting member 21 and the second current regulator 27. With this connection, the efficiency adjusting circuit 25 appropriately adjusts a proportional relationship between the peak power setting value and the current value of the second current regulator 27 determined by the peak power setting value. The result is the coincidence between the peak power setting value and the light power of the semiconductor laser 11, i.e. the output of the semiconductor laser 11.

As described above, the system is stable even if the peak power setting value is changed. Therefore, the present invention is effectively applicable for the improvement of recording quality in an optical disk apparatus of the CAV (constant angular velocity) type in which for the recording quality improvement, the laser power is changed with a radial motion of the optical pick-up in a random access operation. In this case, it is preferable to use a laser beam position information circuit as shown in FIG. 3, in place of the peak power setting member 21. The FIG. 3 circuit comprises a ROM 31 storing address data representing radial beam positions on the optical disk and a D/A converter 32 supplied with the beam position information read out from the ROM 31. More specifically, the ROM 32 stores information of a signal level representing beam positions, as shown in FIG. 4. In response to an address data, it produces corresponding signal level information. The read out level information signal is converted into an analog signal, by the D/A converter 32, and then is applied to the analog multiplier 19 and the efficiency adjusting circuit 25. Finally, the laser light power on a desired radial position on the optical disk is produced by the operational amplifier 17.

In the above-mentioned embodiment, the efficiency adjusting circuit 25 performs a proportional calculation on the peak power setting value and the current value of the second current regulator 27. The calculation by the efficiency adjusting circuit 25, however, is not limited to the proportional one. When the forward current fed to the light emitter e.g. semiconductor laser is larger than the threshold value, use of the proportional calculation is satisfactory for the above purpose since the light emission efficiency ΔP/Δi of the light emitter is fixed. However, the light emission efficiency is nonlinear, use of the mere proportional calculation is unsatisfactory. In this case, the efficiency adjusting circiut 25 must calculate a reverse function of a function representing the nonlinear of the light emission efficiency. A change of the light emission efficiency ΔP/Δi due to aging may be corrected by an automatic adjuster using a microprocessor. Further, the PIN diode may be used for the photosensor, with additional use of a known temperature compensating means.

What is claimed is:

1. A light power controlling apparatus comprising:
   semiconductor light emitting device;
   first current circuit means connected to said light emitting device and for feeding a first current to said light emitting device to cause said light emitting device to emit light;
   photosensor means for producing an electrical signal corresponding to the emitted light from said light emitting device;
   first averaging means for averaging a form factor of an electrical signal of said photosensor means and for generating an average signal corresponding to the averaged form factor;
   error amplifier means for comparing said average signal of said averaging means with a reference signal corresponding to a desired value of light power, thereby to produce a difference signal representing a difference between the average value and said desired value;
   integrator means for integrating said difference signal of said error amplifier means and for feeding the integrated signal as a feedback control signal to said first current circuit means;
   means for generating a modulating signal in a modulating mode;
   second current circuit means connected to said light emitting device and for feeding to said light emitting device a second current according to said modulating signal;
   peak power setting means for setting said second current circuit means at a peak power value in a modulating mode;
   second averaging means connected to said modulating signal generating means for averaging a form factor of said modulating signal to obtain a second average signal; and
   means for adding to said desired value a signal representing the product of said peak power value and said second average signal and for feeding it as a reference signal to said error amplifier means.

2. A light power controlling means according to claim 1, in which said first current circuit means includes a current regulator for regulating the current fed to said light emitting device according to said feedback control signal of said integrator means.

3. A light power controlling apparatus according to claim 1, in which said second current circuit means includes a current regulator of which the peak value is set by said peak power setting means, and switching circuit means connected to said current regulator and for turning on and off said current regulator according to said modulating signal in order to feed a current to said light emitting device according to said modulating signal.

4. A light power controlling apparatus according to claim 1, in which said peak power setting means includes means for producing a voltage signal corresponding to the peak power value and means for adjusting a light emission efficiency of said light emitting device according to said voltage signal.

5. A light power controlling apparatus according to claim 1, in which said first averaging means is a low-pass filter for filtering said electric signal of said photosensor means.

6. A light power controlling apparatus according to claim 1, in which said second averaging means is a low pass filter for filtering said modulating signal.

7. A light power controlling apparatus according to claim 1, in which said light emitting device is a semiconductor laser for emitting laser beams, and said peak power setting means includes means for producing a voltage signal at a level corresponding to a radial laser beam position on an optical disc.

8. A light power controlling apparatus according to claim 7, in which said peak power value setting means includes memory means for storing signal level data representing radial laser beam positions on said optical disk and means for converting a signal level data read out of said memory means into a voltage signal.

* * * * *